(12) United States Patent
Beroz

(10) Patent No.: US 6,867,065 B2
(45) Date of Patent: Mar. 15, 2005

(54) METHOD OF MAKING A MICROELECTRONIC ASSEMBLY

(75) Inventor: Masud Beroz, Livermore, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/614,069

(22) Filed: Jul. 3, 2003

(65) Prior Publication Data

US 2004/0043551 A1 Mar. 4, 2004

Related U.S. Application Data

(60) Provisional application No. 60/393,616, filed on Jul. 3, 2002.

(51) Int. Cl.[7] .......................... H01L 21/44; H01L 21/48; H01L 21/50
(52) U.S. Cl. ...................................... 438/106
(58) Field of Search ........................... 438/106, 51, 55, 438/64, 107, 108, 110, 113, 118, 119

(56) References Cited

U.S. PATENT DOCUMENTS

| 5,148,265 A | | 9/1992 | Khandros et al. |
| 5,148,266 A | * | 9/1992 | Khandros et al. ............. 357/80 |
| 5,518,964 A | * | 5/1996 | DiStefano et al. .......... 438/106 |
| 5,659,952 A | | 8/1997 | Kovac et al. |
| 5,679,977 A | | 10/1997 | Khandros et al. |
| 5,706,174 A | | 1/1998 | Distefano et al. |
| 5,802,699 A | * | 9/1998 | Fjelstad et al. ............... 29/539 |
| 6,169,328 B1 | | 1/2001 | Mitchell et al. |
| 6,190,509 B1 | * | 2/2001 | Haba .......................... 204/164 |
| 6,239,384 B1 | * | 5/2001 | Smith et al. ................. 174/261 |
| 6,518,091 B1 | * | 2/2003 | Haba .......................... 438/107 |

* cited by examiner

Primary Examiner—David Nhu
(74) Attorney, Agent, or Firm—Lerner, David, Littenberg Krumholz & Mentlik, LLP

(57) ABSTRACT

A method of making a microelectronic assembly includes providing a dielectric layer including a first major face having a first adhesive, a second major face having a second adhesive, and a protective liner over the second adhesive, juxtaposing a plurality of microelectronic elements with the first major face of dielectric layer, and assembling the microelectronic elements with the dielectric layer by abutting the microelectronic elements against the first adhesive of the dielectric layer. The method also includes at least partially severing the dielectric layer while maintaining the protective liner as a single piece of material so as to form a plurality of individual microelectronic units overlying the protective liner, whereby each of the individual microelectronic units includes at least one of the microelectronic elements attached to an at least partially severed portion of the dielectric layer.

24 Claims, 6 Drawing Sheets

METHOD OF MAKING A MICROELECTRONIC ASSEMBLY

CROSS REFERENCE TO RELATED APPLICATIONS

The present application claims benefit of U.S. Provisional Application No. 60/393,616 filed Jul. 3, 2002.

BACKGROUND OF THE INVENTION

The present invention relates to methods of making microelectronic assemblies incorporating a plurality of microelectronic elements and separating the assemblies into individual units.

Microelectronic elements, such as semiconductor chips or wafers, are typically packaged and assembled with a microelectronic component to facilitate connection to external circuitry. It is known to assemble a flexible dielectric sheet with microelectronic elements to form a microelectronic package. As disclosed in certain embodiments of commonly assigned U.S. Pat. No. 5,518,964, a microelectronic component has a plurality of leads with tip ends and terminal ends. The tip ends of each lead are bonded to contacts on a semiconductor wafer incorporating a plurality of individual chips. The wafer and microelectronic component are moved in relation to one another so as form a generally S-shaped lead extending between the wafer and the microelectronic component. A flowable dielectric material is introduced between the microelectronic component and the wafer so as to form a dielectric layer between the component and the wafer. After curing the flowable material to form a dielectric layer, the wafer, the microelectronic component and the dielectric layer are simultaneously severed by sawing along lines so as to divide the assembly into individual microelectronic units.

Various methods are used for separating a wafer into individual microelectronic devices. In one method, a semiconductor wafer is secured in a vacuum package and a roller is used to break the wafer into individual units along scribe lines. The individual units are held in place by the vacuum package as the package is placed in a heated press for adhering the microelectronic devices to the lower layer of the package. An upper layer of the package is removed so that the lower layer of the package may be stretched in a vacuum mold, with the lower layer of the package carrying the individual microelectronic devices.

In other known methods, a wafer is secured to a sapphire disk with a layer of wax, and the individual chips of the wafer are separated by separation etching. The individual chips are transferred from the sapphire disk to a glass plate by a wire screen. The wire screen is then removed from the chips after adhering the chips to the glass plate.

In still other known methods, a semiconductor wafer is broken into individual units and then glued to a membrane. The wafer is first secured to a disk, which is removed after the units are glued to the membrane. The units are then transferred to a receiving member having a stretched membrane. The individual units are attached to the stretched membrane. A plurality of transferring and cleaning steps are required in this method.

In spite of the above advances, there remains a need for improved methods of making microelectronic assemblies.

SUMMARY OF THE INVENTION

In one preferred embodiment of the present invention, a method of making a microelectronic assembly includes forming an assembly of units connected to one another. The assembly of units includes a dielectric layer adhered to a plurality of microelectronic elements, whereby each of the units has at least one of the microelectronic elements and a portion of the dielectric layer. At least one unit is removed from the assembly of units for attachment to a microelectronic component such as a substrate. The step of removing one of the units from the assembly of units includes severing the dielectric layer along at least one line between microelectronic elements so that the microelectronic element and the portion of the dielectric layer associated with the unit are removed from the assembly of units. In certain preferred embodiments, the microelectronic elements comprise a wafer incorporating a plurality of semiconductor chips.

The microelectronic elements may be connected to one another, whereby the step of separating the microelectronic elements includes severing the microelectronic elements along at least one line. In other preferred embodiments, the microelectronic elements comprise a semiconductor chip wafer and the step of separating the microelectronic elements includes dicing the wafer. Dicing the wafer desirably includes severing the dielectric layer or a portion thereof.

In certain preferred embodiments, the dielectric layer is severed through the thickness of the dielectric layer. In certain other preferred embodiments, the step of separating comprises at least partially severing the dielectric layer to a depth less than the thickness of the layer.

The step of forming an assembly of units may comprise providing the dielectric layer separately from the microelectronic elements, including forming the dielectric layer so that the dielectric layer has a first major face with adhesive material at the first major face. The first major face may be adhered to the plurality of microelectronic elements.

The dielectric layer preferably has a second major face with a second adhesive material at the second major face and a protective liner or film overlying the second major face. The first major face of the dielectric layer is preferably adhered to the plurality of microelectronic elements and the dielectric layer is severed without severing the protective liner overlying the second major face. The units may be temporarily connected to one another by the protective liner after the step of severing. One or more of the units may be removed from the assembly by engaging the microelectronic elements with a pick and place machine or another engaging device. As used herein, the term "unit" means one or more of the microelectronic elements and a portion of the dielectric layer associated with the microelectronic element(s). Desirably, the unit is removed from the assembly and carried to another location for further processing. The remaining units may remain connected to one another through the protective liner that is maintained as one piece of material.

In certain preferred embodiments, the microelectronic elements have first faces with contacts exposed on the first faces, and second faces facing in a direction opposite from the first faces. The first major face of the dielectric layer may be adhered to the second faces of the microelectronic elements. In certain preferred embodiments, the microelectronic elements are assembled with the dielectric layer so that the contact bearing faces of the microelectronic elements face away from the dielectric layer. In other preferred embodiments, the contacts face toward the dielectric layer.

In still other preferred embodiments, the dielectric layer is formed as a separate element which is assembled with the plurality of microelectronic elements. The dielectric layer may be formed by disposing a flowable material on a surface, and then curing or partially curing the flowable material. The flowable material may be partially cured so that a layer of partially cured, adhesive material is disposed at the first major face and the second major face of the dielectric layer. The adhesive material at the first major face and/or at the second major face may be covered by a protective liner. In certain embodiments, the dielectric layer is formed and one or more protective liners are removed to expose the adhesive before assembling the dielectric layer with other elements. The dielectric layer may also be formed from a sheet of dielectric material that is coated on one or more faces with an adhesive material.

After removing one of the units including one or more of the microelectronic elements attached to a portion of the dielectric layer, the unit is desirably assembled with a microelectronic component, such as a printed circuit board. Desirably, the portion of the dielectric layer associated with the unit is adhered to the microelectronic component. In preferred embodiments, the dielectric layer has its first major face adhered to the one or more microelectronic elements and its second major face adhered to a surface of the microelectronic component.

In certain preferred embodiments, the microelectronic component may comprise a dielectric sheet having a first surface and a second surface facing oppositely from the first surface, with the second major face of the removed portion of the dielectric layer adhered to the second surface of the dielectric sheet. The step of assembling the unit with a microelectronic component may include connecting contacts of the microelectronic element to pads of the dielectric sheet. The dielectric sheet may include pads exposed at the second surface thereof. The pads are desirably connected to terminals exposed at the first surface of the dielectric sheet. The terminals provide a connection to external circuitry such as a circuit board or other microelectronic element. The contacts may be connected to the pads by attaching wires to the contacts at one end of the wires and to the pads at another end of the wires.

In other preferred embodiments, more than one unit is removed from the assembly. For example, two units may be engaged by a pick and place machine, or other device, and the two units may be carried to another location for further processing. The two units may be severed from one another, but engaged and carried as a unit as they are removed. Alternatively, the units may not be severed from one another and may remain connected by the dielectric layer or by the microelectronic elements or both.

In certain preferred embodiments, the step of forming a plurality of units comprises placing individual microelectronic elements on a dielectric layer so that the microelectronic elements are adhered to the dielectric layer. One or more of the individual microelectronic elements are preferably separated from one another before being assembled with the dielectric layer.

In another preferred embodiment of the present invention, a method of making a microelectronic assembly includes a plurality of microelectronic elements connected to one another, the microelectronic elements having first contact bearing faces and second faces facing in a direction opposite from the first faces. The method may include connecting a dielectric layer to the second faces for forming an assembly of units connected to one another, each unit including a microelectronic element and a portion of the dielectric layer, each of the microelectronic elements having one of the portions of the dielectric layer associated therewith, and removing at least one unit from the assembly of units, including severing the unit along at least one line extending between microelectronic elements. The removing step may include severing along a first line and severing along a second line orthogonal to the first line.

In certain preferred embodiments, the plurality of microelectronic elements comprise a semiconductor chip wafer. In other embodiments, the plurality of microelectronic elements comprise individual microelectronic elements engaged by a frame or other support.

In other preferred embodiments, the method may include providing the dielectric layer so that the dielectric layer has an inner region and an adhesive disposed at a first outer region. The dielectric layer desirably has an adhesive disposed at a second outer region, and a protective liner covering the second outer region. The first outer region is adhered to the second faces of the microelectronic elements. The step of removing may comprise separating the portion of the dielectric layer from the liner. In other preferred embodiments of the present invention, a method of making a microelectronic assembly includes providing a plurality of microelectronic elements, connecting a dielectric layer to the plurality of microelectronic elements, separating a portion of the dielectric layer from a remaining portion of the dielectric layer along at least one line extending between two of the plurality of microelectronic elements, and removing the separated portion of the dielectric layer and at least one of the plurality of microelectronic elements connected to the separated portion of the dielectric layer.

In certain preferred embodiments, the plurality of microelectronic elements are connected to one another in a semiconductor wafer and the step of separating a portion of the dielectric layer includes dicing the wafer along the at least one line extending between two of the plurality of microelectronic elements.

The connecting step may include providing a dielectric layer having a first major face, a second major face, a first protective liner over the first major face, and a second protective liner over the second major face, and providing a first adhesive on the first major face of the dielectric layer, whereby a connecting step comprises removing the first protective liner for exposing the first adhesive and adhering the dielectric layer to the plurality of microelectronic elements. The connecting step may also include applying a flowable material to the plurality of microelectronic elements and at least partially curing the flowable material.

The plurality of microelectronic elements may be selected from the group consisting of semiconductor chips, printed circuit boards, memory devices, interposers, stacked chip assemblies, semiconductor wafers and support layers. The plurality of microelectronic elements may be integrated onto a single wafer, whereby the severing step includes dicing the wafer for separating each microelectronic element into an individual unit having a portion of the dielectric layer connected thereto.

The step of removing desirably includes engaging one of the microelectronic elements with a pick and place machine.

The method may also include assembling the separated portion of the dielectric layer and the one or more of the microelectronic elements connected thereto with a microelectronic component. An adhesive may be applied to the dielectric layer so as to adhere the separated portion of the dielectric layer to the microelectronic component. In certain preferred embodiments, the step of providing an adhesive on one or more of the major faces of the dielectric layer includes applying a flowable material to the plurality of microelectronic elements and partially curing the flowable material so that a layer of a partially cured, adhesive material is disposed on one or more outer surfaces of the dielectric layer.

The assembling step may comprise adhering the separated portion of the dielectric layer with the microelectronic component. The microelectronic component desirably has a top layer and a plurality of terminals exposed at the top layer. The top layer of the microelectronic component may include a dielectric material.

In other preferred embodiments of the present invention, a method of making a microelectronic assembly desirably includes providing a dielectric layer including a first major face comprising a first adhesive, a second major face comprising a second adhesive, and a protective liner over the second adhesive, and juxtaposing a plurality of microelectronic elements with the first major face of the dielectric layer. The method may also include assembling the microelectronic elements with the dielectric layer by abutting the microelectronic elements against the first adhesive of the dielectric layer, and at least partially severing the dielectric layer while maintaining the protective liner as a single piece of material so as to form a plurality of individual microelectronic units overlying the protective liner, wherein each individual microelectronic unit includes at least one of the microelectronic elements attached to an at least partially severed portion of the dielectric layer. The at least partially severing step desirably includes completely severing the dielectric layer while maintaining the protective liner as a single piece of material. The assembling a plurality of microelectronic elements step preferably includes providing a semiconductor wafer, and abutting the semiconductor wafer against the first adhesive material at the first major face of the dielectric layer. The at least partially severing step may include dicing the semiconductor wafer into individual units comprising one or more of the microelectronic elements.

The method may also include providing another protective liner over the first adhesive, and removing the another protective liner over the first adhesive before the assembling step. In certain preferred embodiments, the dielectric layer has a fully cured inner region, and at least partially cured outer regions including the first and second adhesives at the first and second major faces of the dielectric layer.

The method may also include removing one of the individual units from attachment with the protective liner so as to expose the second adhesive material at the second major face of the dielectric layer and abutting the second adhesive material with a microelectronic component such as a second microelectronic element so as to form a microelectronic package.

In other preferred embodiments of the present invention, a method of making a microelectronic assembly includes providing a dielectric layer having a first major face comprising a first adhesive, a second major face comprising a second adhesive, and a protective liner over the second adhesive. The method includes juxtaposing a semiconductor wafer including a plurality of semiconductor chips with the first major face of the dielectric layer, assembling the wafer with the dielectric layer by abutting the wafer against the first adhesive at the first major face of the dielectric layer, and maintaining the protective liner as a single piece of material while dicing the wafer and at least partially severing the dielectric layer for forming a plurality of individual microelectronic units overlying the protective liner, wherein each individual microelectronic unit includes at least one of the microelectronic chips attached to an at least partially severed portion of the dielectric layer. The at least partially severing step may include completely severing the dielectric layer while maintaining the protective liner as a single piece of material. The method may also include removing one of the individual microelectronic units from attachment with the protective liner so as to expose the second adhesive material at the second major face of the dielectric layer, and abutting the second adhesive material with a second microelectronic element, such as a substrate or circuit board, for forming a microelectronic package.

These and other preferred embodiments of the present invention will be described in more detail below.

DETAILED DESCRIPTION

Figure 1:
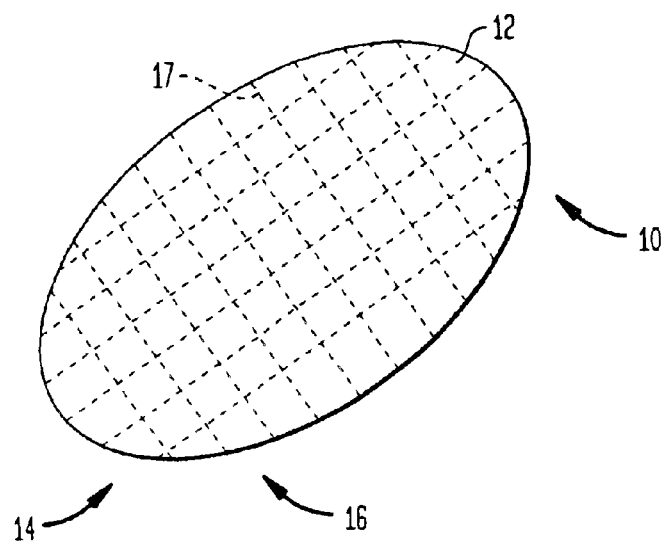
FIG. 1 shows a top view of a semiconductor wafer used to make a microelectronic assembly, in accordance with certain preferred embodiments of the present invention.
Figure 2:
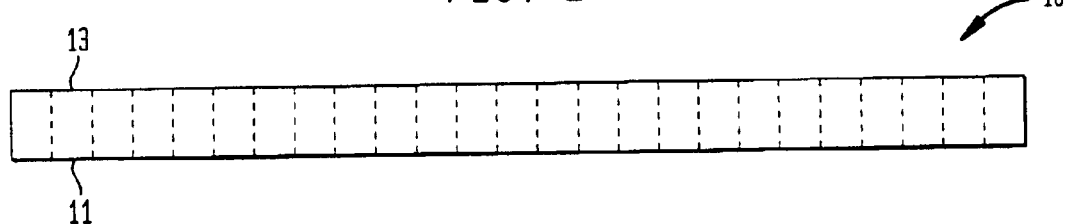
FIG. 2 shows a cross-sectional view of the semiconductor wafer of FIG. 1.

One preferred embodiment of the present invention is shown in FIGS. 1–8. Referring to FIGS. 1 and 2, a semiconductor wafer 10 includes a plurality of microelectronic elements 12 connected together. The wafer 10 has a bottom surface 11 and a top surface 13 and a two-dimensional array of microelectronic elements 12 defined by a number of rows 14 and columns 16. The rows 14 and columns 16 are defined by lines 17. In other preferred embodiments, the wafer 10 may comprise a plurality of microelectronic elements 12 arranged in a one-dimensional array. In other preferred embodiments, an assembly may comprise more than one microelectronic element, such as a pair of microelectronic elements, arranged in a side-by-side arrangement, in a plane, or a stacked arrangement, or a plurality of smaller assemblies of microelectronic elements, such as a plurality of stacked semiconductor chips connected to one another.

As used herein, the term microelectronic element may be used to describe a semiconductor chip, a printed circuit board, an interposer, a wafer, a stacked assembly, or any other assembly of semiconductor chips, support layers, or any other microelectronic element.

Figure 3:
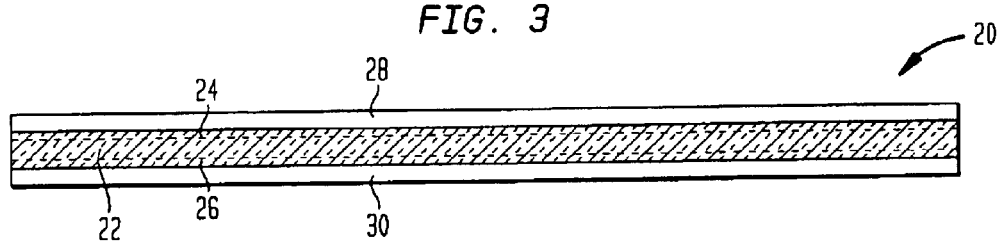
FIG. 3 shows a cross-sectional view of a dielectric layer including first and second protective liners, in accordance with certain preferred embodiments of the present invention.

Referring to FIG. 3, a dielectric layer 20 includes a layer of dielectric material, such as a polymeric material. In other preferred embodiments, the dielectric layer 20 comprises a layer of compliant material or an elastomer material. The dielectric layer may be formed from a flowable, curable material that is stenciled onto a support surface through a mask having an aperture sized and shaped according to the desired final size and shape for the dielectric layer 20. The dielectric layer 20 may be formed to have a shape corresponding to the wafer 10 (FIG. 1), because the dielectric layer 20 and wafer 10 are to be assembled with one another. After dispensing a flowable dielectric material, this material is desirably cured. A flowable dielectric layer may also be molded or spin coated onto a support. In preferred embodiments, the dielectric layer 20 is formed from a flowable, curable dielectric material which is partially cured so as to have an inner region 22, a first outer region 24 and a second outer region 26. The inner region 22 desirably comprises a region of material that is fully cured, whereas the first outer region 24 and second outer region 26 preferably comprise a region which is B-stage cured. Preferably, the B-stage regions 24 and 26 comprise an adhesive and are protected by a first liner 28 and a second liner 30, respectively.

Figure 4:
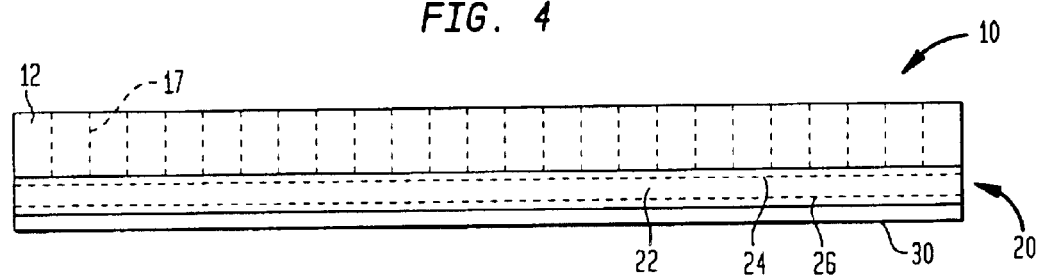
FIG. 4 shows the semiconductor wafer of FIG. 2 assembled with the dielectric layer of FIG. 3.

Before assembling wafer 10 with dielectric layer 20, the first protective liner 28 is preferably removed to expose the first outer region 24 of the dielectric layer 20. As shown in FIG. 4, the dielectric layer 20 is assembled with the wafer 10 so that a surface of the wafer 10 and first outer region 24 are brought into engagement with one another. In certain preferred embodiments, heat is applied so as to laminate the dielectric layer 20 onto the wafer 10. In certain preferred embodiments, the first outer region 24 is partially cured so that the dielectric layer 20 is securely attached to the wafer 10. Preferably, the second outer region 26 is not fully cured and is protected by the second protective liner 30.

Figure 5:
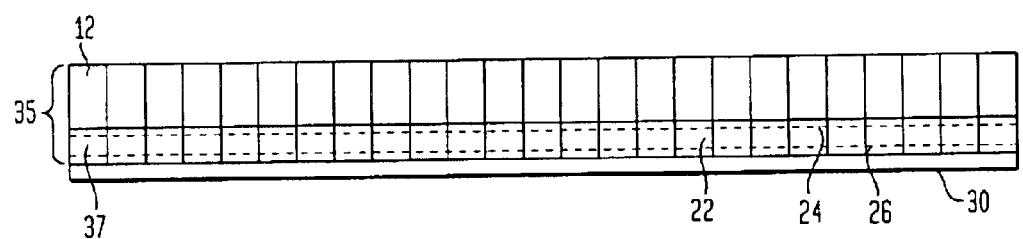
FIG. 5 shows the assembly of FIG. 4 after the semiconductor wafer has been diced and the dielectric layer has been at least partially severed, in accordance with certain preferred embodiments of the present invention.

As shown in FIG. 5, the wafer 10 and dielectric layer 20 is severed along the lines 17 separating the individual microelectronic elements 12. Severing along these lines 17 produces individual units 35 comprising at least one microelectronic element 12 having an individual layer 37 of dielectric layer 20 attached thereto. The severing operation may comprise cutting the wafer 10 and dielectric layer 20 utilizing a laser or saw or other cutting device. Preferably, the second protective liner 30 is not cut during the severing operation and is maintained as a single piece of material. The dielectric layer 20 may be cut through its entire thickness or partially cut. In certain preferred embodiments, the wafer 10 has a plurality of scribe lines indicating locations for separating individual units. The microelectronic elements may also be separated using a roller to break the connections between the microelectronic elements.

Figure 6:
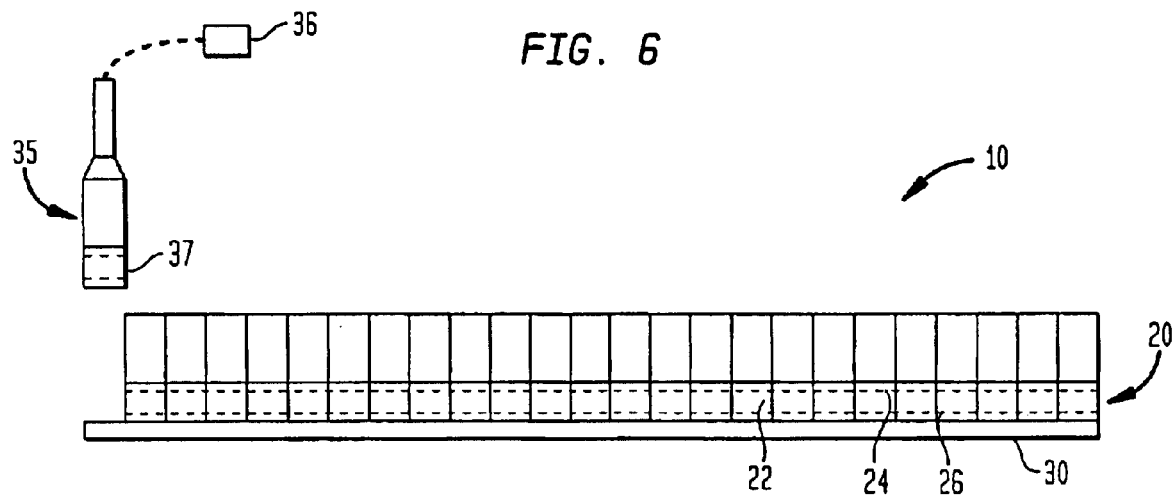
FIG. 6 shows a unit including a microelectronic element separated from the wafer and a portion of the dielectric layer, in accordance with certain preferred embodiments of the present invention.

Referring to FIG. 6, each of the separated units 35 are removed from the second liner 30. In a preferred embodiment, a pick and place machine 36 is utilized to engage one of the units 35 and remove the unit 35, including the individual layer 37 attached thereto and move the unit 35 into engagement with a microelectronic component 39 (FIG. 7).

Figure 7:
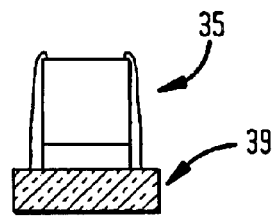
FIG. 7 shows the removed unit of FIG. 6 assembled with a microelectronic component, in accordance with certain preferred embodiments of the present invention.
Figure 8:
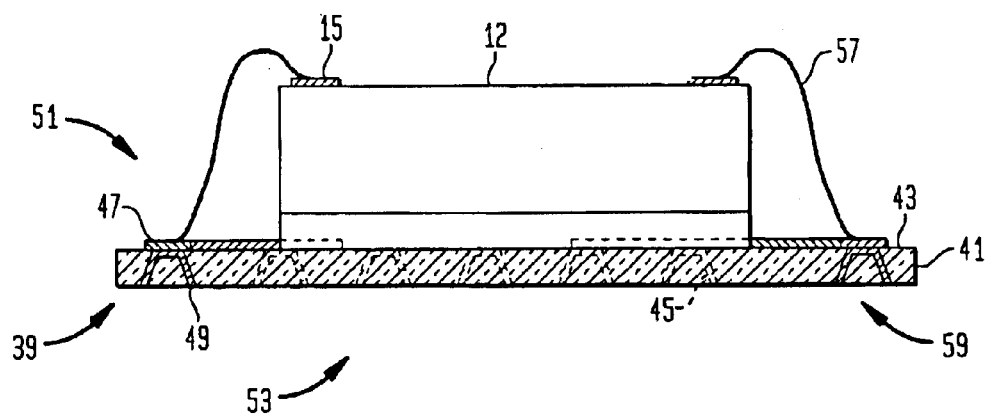
FIG. 8 shows a detailed view of the assembly of FIG. 7.

Referring to FIGS. 7 and 8, in certain preferred embodiments, microelectronic component 39 comprises a dielectric sheet 41 made of a dielectric material and may comprise a polymer such as polyimide. The dielectric sheet may include a plurality of layers of dielectric materials. The dielectric sheet has an upper surface 43 and a lower surface 45, and a plurality of pads 47 accessible at the upper surface 43 of the dielectric sheet 41. In certain preferred embodiments, the dielectric sheet 41 has a plurality of vias 49 extending from the upper surface 43 to the lower surface 45. The vias 49 are aligned with the pads 47 and are accessible at the lower surface 45 of the dielectric sheet 41. The dielectric sheet 41 may incorporate other conductive features, including planar conductive features or features having any other shape. The pads 47 and vias 49 are, in certain preferred embodiments, disposed adjacent peripheral regions 51 of the dielectric sheet 41. The dielectric sheet 41 has a central region 53 disposed inwardly of the peripheral regions 51. In certain preferred embodiments, the central region 53 does not include pads 47. The pads 47 are disposed outwardly of the unit 35, as shown in FIG. 8. However, in other embodiments, the pads are distributed across a surface of the sheet 41. In other preferred embodiments, certain ones of the pads 47 are attached to traces 55 extending on a surface of the dielectric sheet or between layers of the dielectric sheet 41. The traces may communicate with vias 49 that extend through the central region 53 of the dielectric sheet 41. Thus, in certain preferred embodiments, the microelectronic component 39 incorporates vias 49 that are disposed in the central region 53 of the dielectric sheet. The vias 49 are accessible at the lower surface 45 for forming connections with external circuitry. The component may be formed as disclosed in certain embodiments of U.S. Pat. Nos. 5,148,266, 5,148,265, and 5,679,977, the disclosures of which are hereby incorporated by reference herein.

Referring to FIGS. 6 and 8, the second outer region 26 of the dielectric layer 20 is brought into engagement with the upper surface 43 of dielectric sheet 41 so that the individual layer 37 is adhered to the upper surface 43 of the dielectric sheet 41. The individual unit 35 is attached to the microelectronic component 39 so that contacts 15 of chip 12 face away from the microelectronic component 39. Each of the contacts 15 are connected to a pad 47 on the dielectric sheet 41. In certain preferred embodiments, wire bonding wires are used to attach each of the contacts 15 to a pad 47. A wire 57 is attached at one end to a contact and attached at another end to a pad 47. The vias 49 in the dielectric sheet 41 are desirably used to form terminals that are used to connect the unit 35 to external circuitry. The terminals 59 may comprise solder balls disposed in the vias 49. The vias 49 are desirably lined with electrically conductive material, as is known in the art. Solder balls (not shown) may be disposed within the vias 49 so as to create electrical contact with the electrically conductive material in the vias 49. The electrically conductive material is disposed in the vias 49 so as to be in contact with the pads 47. The terminals may comprise any other structure for forming connections with external circuitry.

Although the microelectronic element shown in FIG. 8 has contacts at a peripheral region of the microelectronic element, the microelectronic element may have contacts arranged in one or more rows in a central region of the first face, distributed across the first face in an array, or any other configuration.

Figure 9:
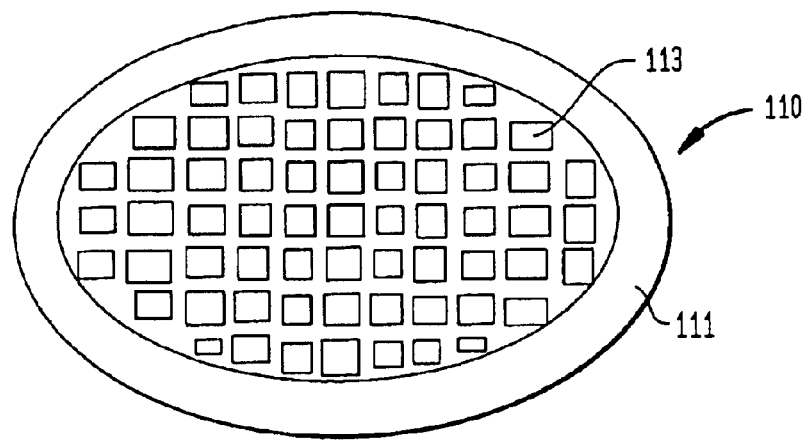
FIGS. 9–12 show a method of making a microelectronic assembly, in accordance with other preferred embodiments of the present invention.
Figure 10:
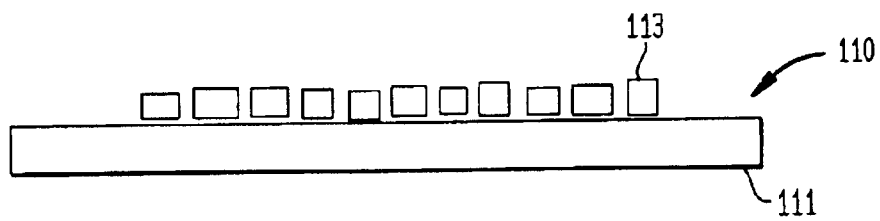
Figure 11:
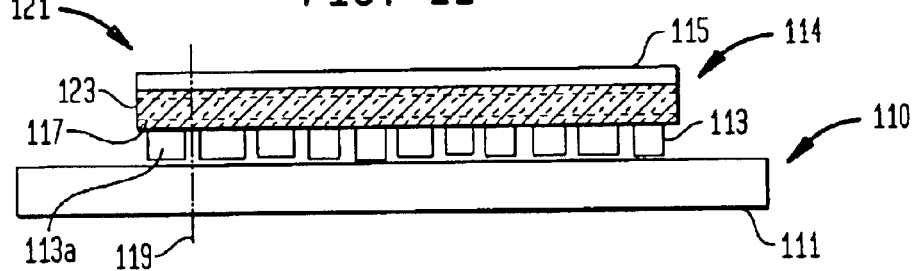

Another preferred embodiment of the invention is shown in FIGS. 9–11. The assembly of microelectronic elements 110 may comprise a frame 111 or other support for holding individual microelectronic elements 113, as shown in FIG. 9. FIG. 10 shows a cross-sectional view of the assembly 110 having a frame 111 holding a plurality of microelectronic elements 113. The frame 111 may comprise a grid for holding the individual elements 113. Alternatively, the elements 113 may be adhered to the frame 111. Referring to FIG. 11, a dielectric layer 114 is assembled with the assembly 110 of microelectronic elements 113. The dielectric layer 114 may be provided separately and may be applied to the plurality of microelectronic elements 113 so that the dielectric layer 114 overlies the plurality of microelectronic elements 113 and frame 111. The dielectric layer 114 may comprise a layer having fully cured regions and partially cured, or B-stage cured regions, as discussed above. Desirably, the partially cured regions are accessible at the outer surfaces of the dielectric layer and are protected by one or more protective liners 115. The partially cured regions may include a region 117 that is used to adhere the dielectric layer 114 to the plurality of microelectronic elements 113. The assembly 110 and dielectric layer 114 may be separated along lines 119 dividing the microelectronic elements 113. For example, the dielectric layer 114 and frame 111 may be severed along line 119 shown in FIG. 11 to remove a unit 121 from the assembly. The unit 121 preferably includes at least one microelectronic element 113a and an individual layer 123 (i.e. a section or portion of dielectric layer 114) which is adhered to the microelectronic element 113a. Desirably, the top protective liner 115 is not severed and is maintained as a single piece of material. The unit 121 is preferably removed from the liner 115 using a pick-and-place machine and may be assembled with a microelectronic component, such as the component shown in FIG. 8, or any other microelectronic component or other microelectronic elements.

Figure 12:
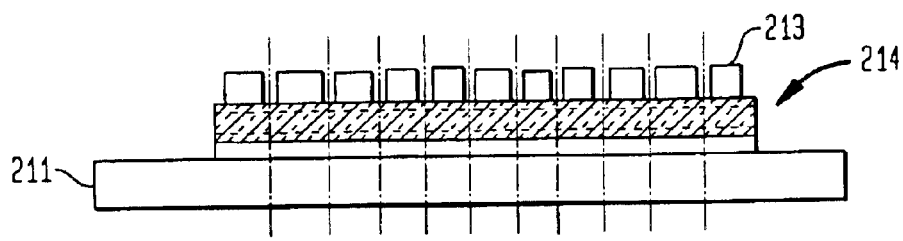

In a further embodiment of the present invention, as shown in FIG. 12, a dielectric layer 214 may be formed on a support 211, and microelectronic elements 213 are placed on the dielectric layer 214 so that the microelectronic elements 213 adhere to the layer 214. The microelectronic elements 213 may be placed on the layer 214 using a pick and place machine or any other device, individually or as a group.

Figure 13:
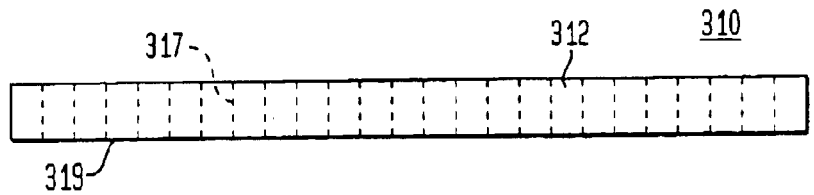
FIGS. 13–17 show a method of making a microelectronic assembly, in accordance with still further preferred embodiments of the present invention.

Referring to FIG. 13, a semiconductor wafer 310 includes a plurality of semiconductor chips 312 defined by lines 317 that separate the wafer 310 into rows and columns (not shown). The semiconductor wafer 310 has a contact-bearing face 319. In other words, the contacts for the microelectronic chips 312 are all located on a common face 319 of wafer 310.

Figure 14:
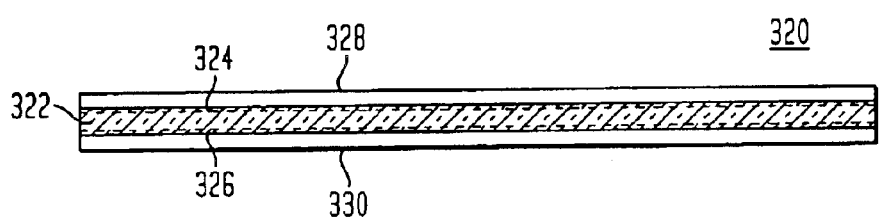

Referring to FIG. 14, a dielectric layer 320 has a fully cured center region 322, a partially cured first outer region 324, and a partially cured second outer region 326. The first outer region 324 is covered by a first protective liner 328 and the second outer region 326 is covered by a second protective liner 330.

Figure 15:
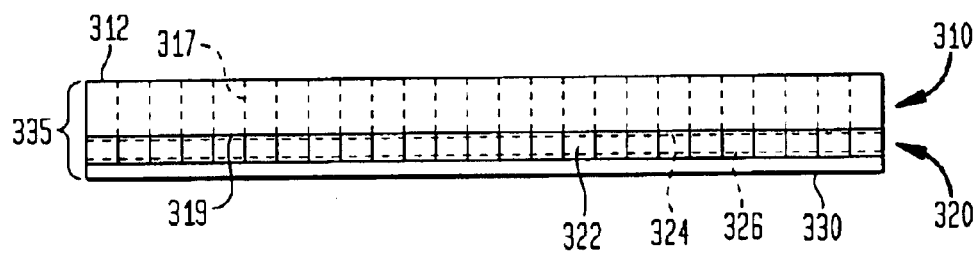

Referring to FIGS. 13–15, the semiconductor wafer 310 is assembled with dielectric layer 320 by first removing first protective layer 328 so as to expose first outer region 324. The contact-bearing face 319 of semiconductor wafer 310 is juxtaposed with the first outer region 324 of dielectric layer 320. As noted above, the first outer region 324 is preferably B-stage cured so as to provide an adhesive for adhering the dielectric layer 320 and the semiconductor wafer 310 together. The contact-bearing face 319 is abutted against the first outer region 324 for assemblying the semiconductor wafer 310 and the dielectric 320 together. The assembly may be separated into individual microelectronic units 335 by dicing the semiconductor wafer 310 along lines 317 and at least partially severing dielectric layer 320 so as to at least partially sever the first outer layer 324, the fully cured inner region 322 and the second outer region 326 of dielectric layer 320. The second protective layer 330 is preferably not cut or severed and is maintained as one piece of material for holding together all of the individual units 335.

Figure 16:
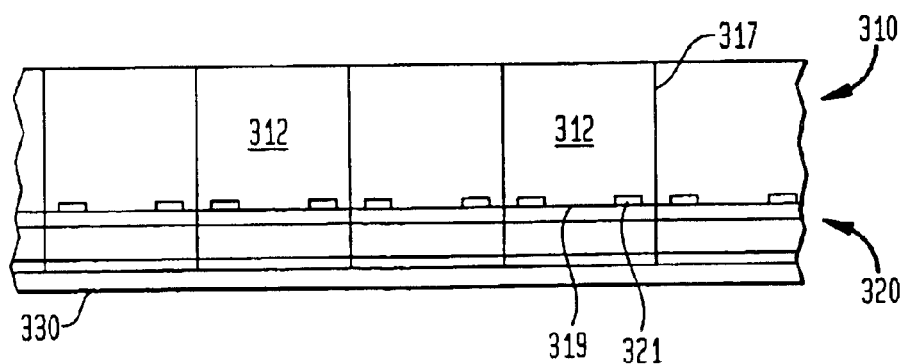

FIG. 16 shows the plurality of microelectronic elements 312 diced along lines 317 so as to divide the semiconductor wafer 310 and the dielectric layer 320 into a plurality of individual units 335 held together by second protective layer 330. As noted above, each semiconductor chip 312 has a contact-bearing face 319 including contacts 321.

Figure 17:
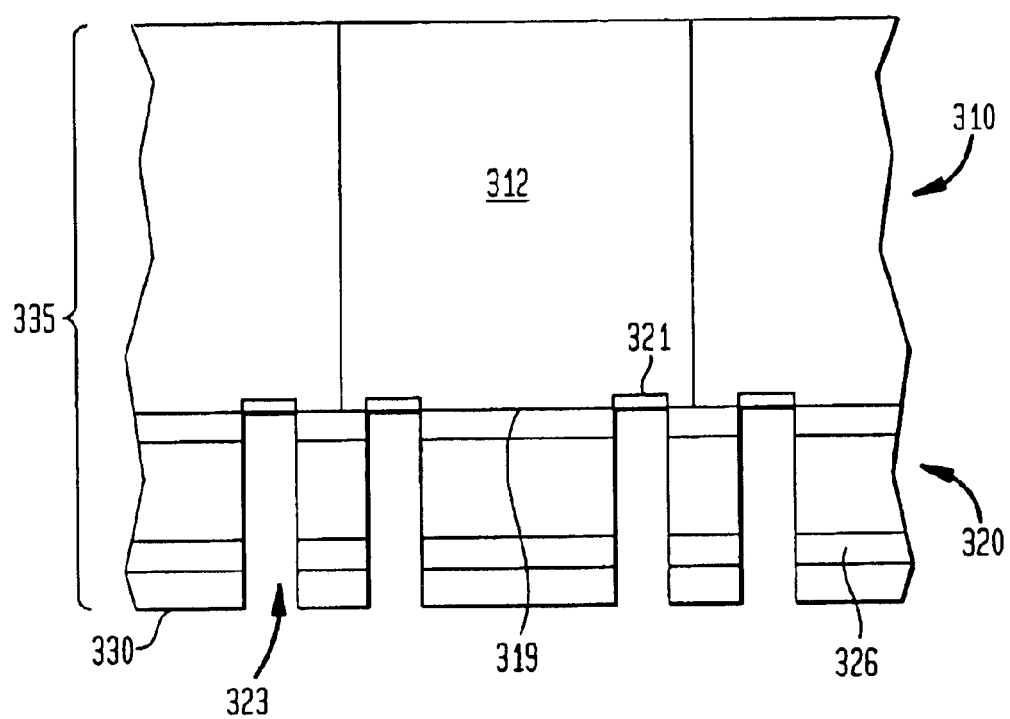

Referring to FIG. 17, blind vias 323 are formed through second protective liner 330 and dielectric layer 320 so as to expose contacts 312 at the contact-bearing face 319 of semiconductor chip 312. The vias may be formed by lasers, chemicals or mechanical means such as a drill. The vias are more preferably formed by laser ablation or chemical etching. The vias facilitate the creation of electrical interconnections between semiconductor chips 312 and an external circuit element (not shown), such as a printed circuit board. In certain preferred embodiments, the second protective liner may be removed so as to expose the second outer region 326. As noted above, the second outer region 326 is preferably B-stage cured so as to provide an adhesive at the second outer region of dielectric layer 320. The second outer layer 326 may then be abutted against the top surface of an external circuit element for assembling the individual unit 335 with the external circuit element. A conductive material, such as solder, may be provided in the vias 323 for creating an electrical interconnection between contacts 321 and conductive pads (not shown) of the external circuit element.

In other preferred embodiments, the dielectric layer may be formed in accordance with certain embodiments of U.S. Pat. Nos. 5,659,952; 5,706,174; and 6,169,328, the disclosures of which are hereby incorporated by reference herein.

Although the invention herein has been described with reference to particular embodiments, it is to be understood that these embodiments are merely illustrative of the principles and applications of the present invention. In other embodiments of the invention, for example, the plurality of microelectronic elements comprises individual semiconductor chips, or other microelectronic elements, engaged by a frame or support. The microelectronic elements may be assembled with the dielectric layer so that a contact bearing face of the microelectronic element faces the dielectric layer. The dielectric layer may include apertures or windows for allowing access to contacts. The microelectronic component may further include windows or apertures. The contacts may be connected to pads or terminals using leads, wires or any conductive material. It is therefore to be understood that numerous modifications may be made to the illustrative embodiments and that other arrangements may be devised without departing from the spirit and scope of the present invention as defined by the appended claims.

What is claimed is:

1. A method of making a microelectronic assembly, comprising:

providing a plurality of microelectronic elements;

adhering a dielectric layer to said plurality of microelectronic elements;

separating a portion of said dielectric layer from a remaining portion of said dielectric layer along at least one line extending between two of said plurality of microelectronic elements; and removing the separated portion of said dielectric layer and at least one of said plurality of microelectronic elements adhered to said separated portion of said dielectric layer.

2. The method of claim 1, wherein the plurality of microelectronic elements are connected to one another in a semiconductor wafer and the step of separating a portion of said dielectric layer includes dicing said wafer along the at least one line extending between two of said plurality of microelectronic elements.

3. The method of claim 1, wherein the adhering step includes providing said dielectric layer having a first major face, a second major face, a first protective film over the first major face, and a second protective film over the second major face.

4. The method of claim 3, further comprising providing a first adhesive on the first major face of said dielectric layer, wherein the adhering step comprises removing the first protective liner for exposing the first adhesive and abutting the first major face of said dielectric layer against said plurality of microelectronic elements.

5. The method of claim 1, wherein the connecting step further comprises applying a flowable material to the plurality of microelectronic elements and at least partially curing the flowable material.

6. The method of claim 1, wherein said plurality of microelectronic elements are selected from the group consisting of semiconductor chips, printed circuit boards, memory devices, interposers, stacked chip assemblies, semiconductor wafers and support layers.

7. The method of claim 1, wherein said plurality of microelectronic elements are integrated onto a wafer and wherein the separating step includes dicing the wafer for separating each microelectronic element into an individual unit having a portion of said dielectric layer connected thereto.

8. The method of claim 1, wherein the step of removing includes engaging one of the microelectronic elements with a pick and place machine.

9. The method of claim 1, further comprising assembling the separated portion of said dielectric layer and the at least one of said plurality of microelectronic elements connected thereto with a microelectronic component.

10. The method of claim 9, further comprising applying adhesive to said dielectric layer and adhering the separated portion of said dielectric layer to the microelectronic component.

11. The method of claim 9, wherein the assembling step comprises adhering the separated portion of said dielectric layer with the microelectronic component.

12. The method of claim 11, wherein the microelectronic component has a top layer and a plurality of terminals exposed at the top layer.

13. The method as claimed in claim 12, wherein the top layer of said microelectronic component includes a dielectric material.

14. The method of claim 4, wherein the providing an adhesive on the first major face of said dielectric layer includes applying a flowable material to the plurality of microelectronic elements and partially curing the flowable material so that a layer of a partially cured, adhesive material is disposed on an outer surface of said dielectric layer.

15. A method of making a microelectronic assembly comprising:
providing a dielectric layer including a first major face comprising a first adhesive, a second major face comprising a second adhesive, and a protective liner over the second adhesive;
juxtaposing a plurality of microelectronic elements with the first major face of said dielectric layer;
assembling said microelectronic elements with said dielectric layer by abutting said microelectronic elements against the first adhesive of said dielectric layer;
at least partially severing said dielectric layer while maintaining the protective liner as a single piece of material so as to form a plurality of individual microelectronic units overlying said protective liner, wherein each said individual microelectronic unit includes at least one of said microelectronic elements attached to an at least partially severed portion of said dielectric layer.

16. The method as claimed in claim 15, further comprising:
providing the protective liner over the second adhesive and providing another protective liner over the first adhesive; and
removing the another protective liner over the first adhesive before the assembling step.

17. The method as claimed in claim 15, wherein said dielectric layer comprises:
a fully cured inner region;
partially cured outer regions including the first and second adhesives at the first and second major faces of said dielectric layer.

18. The method as claimed in claim 15, wherein the at least partially severing step comprises completely severing said dielectric layer while maintaining said protective liner as a single piece of material.

19. The method as claimed in claim 15, wherein the assembling a plurality of microelectronic elements step comprises:
providing a semiconductor wafer; and
abutting said semiconductor wafer against the first adhesive material at the first major face of said dielectric layer.

20. The method as claimed in claim 19, wherein the at least partially severing step includes dicing said semiconductor wafer to separate said microelectronic elements from one another.

21. The method as claimed in claim 19, further comprising:
removing one of said individual units from attachment with said protective layer so as to expose said second adhesive material at the second major face of said dielectric layer;
abutting said second adhesive material with a second microelectronic element so as to form a microelectronic package.

22. A method of making a microelectronic assembly comprising:
providing a dielectric layer including a first major face comprising a first adhesive, a second major face comprising a second adhesive, and a protective liner over the second adhesive;
juxtaposing a semiconductor wafer including a plurality of semiconductor chips with the first major face of said dielectric layer;
assembling said wafer with said dielectric layer by abutting said wafer against the first adhesive of said dielectric layer;
maintaining the protective liner as a single piece of material while dicing said wafer and at least partially severing said dielectric layer for forming a plurality of individual microelectronic units overlying said protective liner, wherein each said individual microelectronic unit includes at least one of said microelectronic chips attached to an at least partially severed portion of said dielectric layer.

23. The method as claimed in claim 22, wherein the at least partially severing step comprises completely severing said dielectric layer while maintaining said protective liner as a single piece of material.

24. The method as claimed in claim 22, further comprising:
removing one of said individual microelectronic units from attachment with said protective layer so as to expose the second adhesive material at the second major face of said dielectric layer;
abutting said second adhesive material of said dielectric layer with a second microelectronic element for forming a microelectronic package.

* * * * *